(12) United States Patent
Christensen et al.

(10) Patent No.: US 7,852,693 B2
(45) Date of Patent: Dec. 14, 2010

(54) APPARATUS FOR AND METHOD OF CURRENT LEAKAGE REDUCTION IN STATIC RANDOM ACCESS MEMORY ARRAYS

(75) Inventors: Todd A Christensen, Rochester, MN (US); Elizabeth L Gerhard, Rochester, MN (US); Omer Heymann, Moshav Tzofit (IL); Amira Rozenfeld, Hertzeliyya (IL)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 11/970,035

(22) Filed: Jan. 7, 2008

(65) Prior Publication Data

US 2009/0175107 A1 Jul. 9, 2009

(51) Int. Cl.
*G11C 7/00* (2006.01)
(52) U.S. Cl. ............... 365/203; 365/204; 365/154
(58) Field of Classification Search .......... 365/203, 365/204, 154
See application file for complete search history.

(56) References Cited

U.S. PATENT DOCUMENTS

| | | | |
|---|---|---|---|
| 4,856,103 A | 8/1989 | Compton | |
| 6,724,648 B2 | 4/2004 | Khellah et al. | |
| 7,307,907 B2 * | 12/2007 | Houston | 365/222 |
| 7,499,312 B2 * | 3/2009 | Matick et al. | 365/154 |
| 2002/0114204 A1 | 8/2002 | Thijs et al. | |
| 2006/0158943 A1 | 7/2006 | Park et al. | |

OTHER PUBLICATIONS

Sharifkhanir et al., "A Low Power SRAM Architecture Based on Segmented Virtual Grounding", <http://delivery.acm.org/10.1145/1170000/1165635/p256-sharifkhani.pdf?key1=1165635&key2=4126760711&coll=&dl=acm&DFID=15151515&CFT>.
Kanda et al., "Two Orders of Magnitude Leakage Power Reduction of Low Voltage SRAMs by Row-by-Row Dynamic Vdd Control (RRDV) Scheme", Proceedings 15th Annual IEEE International ASIC/SOC Conference (Cat. No. 02TH8626), 2002, pp. 381-385.
Romanovsky et al., "Leakage Reduction Techniques in a 0.13 UM SRAM Cell", Proceedings. 17th International Conference on VLSI Design, 2004, pp. 215-221.
Aly et al., Precharged SRAM Cell for Ultra Low-Power On-Chip Cache, Proceedings IEEE International SOC Conference, Proceedings—IEEE International SOC Conference, 2005 SOCC, 2005, pp. 95-98.

* cited by examiner

*Primary Examiner*—Son Dinh
*Assistant Examiner*—Nam Nguyen

(57) ABSTRACT

A novel and useful mechanism for reducing current leakage in a static random access memory array which significantly reduces the power requirements of the memory array. The method enables the steady state of all local and global bit lines in an SRAM array to be discharged during both active and inactive modes. The memory array includes memory cells having an N channel field effect transistor read stack. A mechanism is provided to evaluate data from memory cells where the steady state of local and global read bit lines is discharged.

11 Claims, 7 Drawing Sheets

APPARATUS FOR AND METHOD OF CURRENT LEAKAGE REDUCTION IN STATIC RANDOM ACCESS MEMORY ARRAYS

FIELD OF THE INVENTION

The present invention relates to the field of microprocessor design, and more particularly relates to a method of reducing current leakage in static random access memory (SRAM) arrays by enabling the steady state of all local and global bit lines in an SRAM array to be discharged during both active and inactive modes.

BACKGROUND OF THE INVENTION

Microprocessor designers are increasingly relying on greater amounts of cache memory in order to increase their performance. In addition, new manufacturing processes, for example, 65 and 45 nanometer (nm) processes are enabling hardware designers to incorporate more cache memory in their designs. Cache memory is extremely fast memory used by the central processing unit to reduce the average time to retrieve data from the most frequently accessed primary memory locations.

Higher density manufacturing processes (e.g., 65 and 45 nm) are resulting in greater current leakage. These manufacturing processes are enabling microprocessor designers to incorporate increasing amounts of cache memory in their designs. Therefore, both the increasing quantity of cache memory and the higher density of microprocessor designs are both contributing to an increase in current leakage, even when the microprocessor is not in use.

Typically, static random access memory (SRAM) is implemented as cache memory on board the microprocessor. Data from an SRAM memory cell is read by first precharging the entire SRAM array and then evaluating the data from the appropriate memory cell. An example of a cache memory element circuit is a two port eight transistor SRAM (8T SRAM). An 8T SRAM is comprised of a memory storage circuit and two separate ports, one for reading data from the memory storage circuit and one for writing data to the memory storage circuit. Data is stored in the memory storage circuit which is comprised of two N channel field effect transistors (NFETs) and two P channel field effect transistors (PFETs). In conventional operation, data is written to the memory cell via a write word line (WWL) and a write bit line (WBL), each coupled to a NFET which is in turn coupled to the memory storage circuit.

Data is read from the memory circuit via an NFET read stack, which is comprised of two NFETs connected in series, with one end coupled to a read bit line and the other end coupled to ground. The gate of the NFET coupled to the read bit line is coupled to a control signal, and the gate of the NFET coupled to ground is coupled to the memory storage circuit.

A read operation is executed by first precharging the read bit line during the first phase of the clock cycle. During the second phase of the clock cycle the data stored in the memory circuit is evaluated via the activated read bit line. If the value read from the memory circuit equals 0 then the read bit line is discharged, and if the value read from the memory circuit equals 1 then the read bit line remains charged (i.e. from the precharge). Note that in the prior art, the steady state of all local and global bit lines of a SRAM array containing this type of memory cell is precharged.

A problem associated with this memory cell is that after an SRAM cell is precharged, current leakage occurs in the NFET read stack. In some designs a majority of the microprocessor's power consumption during an active mode is lost to leakage in arrays of SRAM cache memory cell. For idle microprocessors, SRAM memory array leakage can account for as much as 50% of overall power consumption. Current leakage is an increasing concern to both microprocessor designers and users, given the increased number of SRAM memory cells incorporated in microprocessor designs and the increasing use of powerful microprocessors in both portable devices and large server farms. Another major concern is that increased power consumption is also contributing to greater amounts of heat being generated by microprocessors.

Traditional methods employed to conserve power in microprocessors include employing power reducing modes such as shutdown and hibernate modes. Both these modes conserve power when the microprocessor is not in use. In shutdown mode memory and microprocessor states are first stored to secondary memory (e.g., a hard disk). Power to the microprocessor is then shut off. Prior to using the microprocessor, memory and states need to be restored from secondary memory when power is reapplied. In hibernate mode (also referred to as sleep mode) voltage to the microprocessor is reduced to a minimum level, which is sufficient to retain data and states stored in the microprocessor, but is not sufficient to enable operation of the microprocessor.

While both shutdown and hibernate modes save power, they only save power when the microprocessor is not in active mode (also called functional mode). During active mode, the current leakage issue still persists. Furthermore, there is a performance penalty exacted when entering and exiting these power saving modes. This is especially true in shutdown mode where a large amount of data to be is transferred to and from secondary storage when entering and exiting this mode.

Therefore, there is a need for a mechanism to reduce current leakage in SRAM arrays while the microprocessor is in both active and inactive modes. Reducing current leakage during both active and inactive modes should result in power savings without impacting memory array performance.

SUMMARY OF THE INVENTION

The present invention provides a solution to the prior art problems discussed hereinabove. The current leakage reduction mechanism of the present invention is operative to set the steady state of all inactive local bit lines to be discharged. In addition, the steady state of all inactive global bit lines is discharged. The present invention also provides a mechanism to read data from a memory cell where the steady state of all local and global bit lines is discharged.

The present invention utilizes static random access memory (SRAM) cells comprising a memory storage circuit and an N channel field effect transistor (NFET) read stack. An NFET read stack comprises a plurality of NFETs coupled in series, with one end coupled to a read bit line and the other end coupled to ground. The gate of the NFET coupled to the read bit line is coupled to a control signal, and the gate of the NFET coupled to ground is coupled to the memory storage circuit.

In the SRAM memory array of the present invention, the steady state of all local and global bit lines of the SRAM array is discharged. Reading an SRAM cell in the present invention involves three steps: (1) discharge all local and global bit lines (2) precharge the appropriate local and global bit lines; and (3) evaluate the data in the memory cell. Since these three steps are performed during a single clock cycle, the present invention also provides a fast decode path method in order to meet timing constraints.

The invention is operative to facilitate the development of synthesis tools which generate more efficient SRAM arrays to be incorporated in a microprocessor design. Efficient SRAM arrays will consume less power during both active and inactive modes while not impacting performance.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a method of reading a memory cell, the method comprising the steps of discharging the read bit line of said memory cell, precharging said read bit line and evaluating data from said memory cell.

There is also provided in accordance with the invention, a local evaluation circuit coupled to a global bit line and to a plurality of memory cells with read bit lines, the local evaluation circuit comprising means for discharging read bit lines of a plurality of memory cells coupled to said local evaluation circuit during an active mode, means for discharging a global bit line coupled to said local evaluation circuit during said active mode, means for precharging read bit lines of a plurality of memory cells coupled to said local evaluation circuit during said active mode, means for precharging a global bit line coupled to said local evaluation circuit during said active mode and means for transferring data from a memory cell coupled to said local evaluation circuit to a global bit line.

There is further provided in accordance with the invention, a method for discharging local bit lines and a global bit line coupled to a plurality of memory cells, the method comprising the steps of discharging said local bit lines, discharging said global bit line, precharging said global bit line, precharging said local bit lines and evaluating data stored in one of said plurality of memory cells.

BRIEF DESCRIPTION OF THE DRAWINGS

The invention is herein described, by way of example only, with reference to the accompanying drawings, wherein.

DETAILED DESCRIPTION

Notation Used Throughout

The following notation is used throughout this document.

| Term | Definition |
| --- | --- |
| SRAM | Static Random Access Memory |
| NFET | N Channel Field Effect Transistor |
| PFET | P Channel Field Effect Transistor |
| 8T SRAM | Eight Transistor Static Random Access Memory |
| LBL | Local Bit Line |
| LEC | Local Evaluation Circuit |
| RWL | Read Word-Line |
| D1 | A dynamic node |
| GBL_EN | Global Bit Line Enable |

DETAILED DESCRIPTION

The present invention is a novel and useful mechanism for reducing current leakage in an SRAM array comprising memory cells that are accessed by an NFET read stack. The current leakage reduction mechanism of the invention enables reading memory cells in a SRAM array whose read bit lines steady state is discharged. The discharged steady state dramatically reduces current leakage and therefore reduces power consumption in the SRAM array.

The present invention utilizes SRAM memory cells comprise a memory storage circuit and an NFET read stack (also called a pulldown stack). An NFET read stack comprises a plurality of NFETs coupled in series, with one end coupled to a read bit line and the other end coupled to ground. The gate of the NFET coupled to the read bit line is coupled to a control signal, and the gate of the NFET coupled to ground is coupled to the memory storage circuit.

Figure 1:
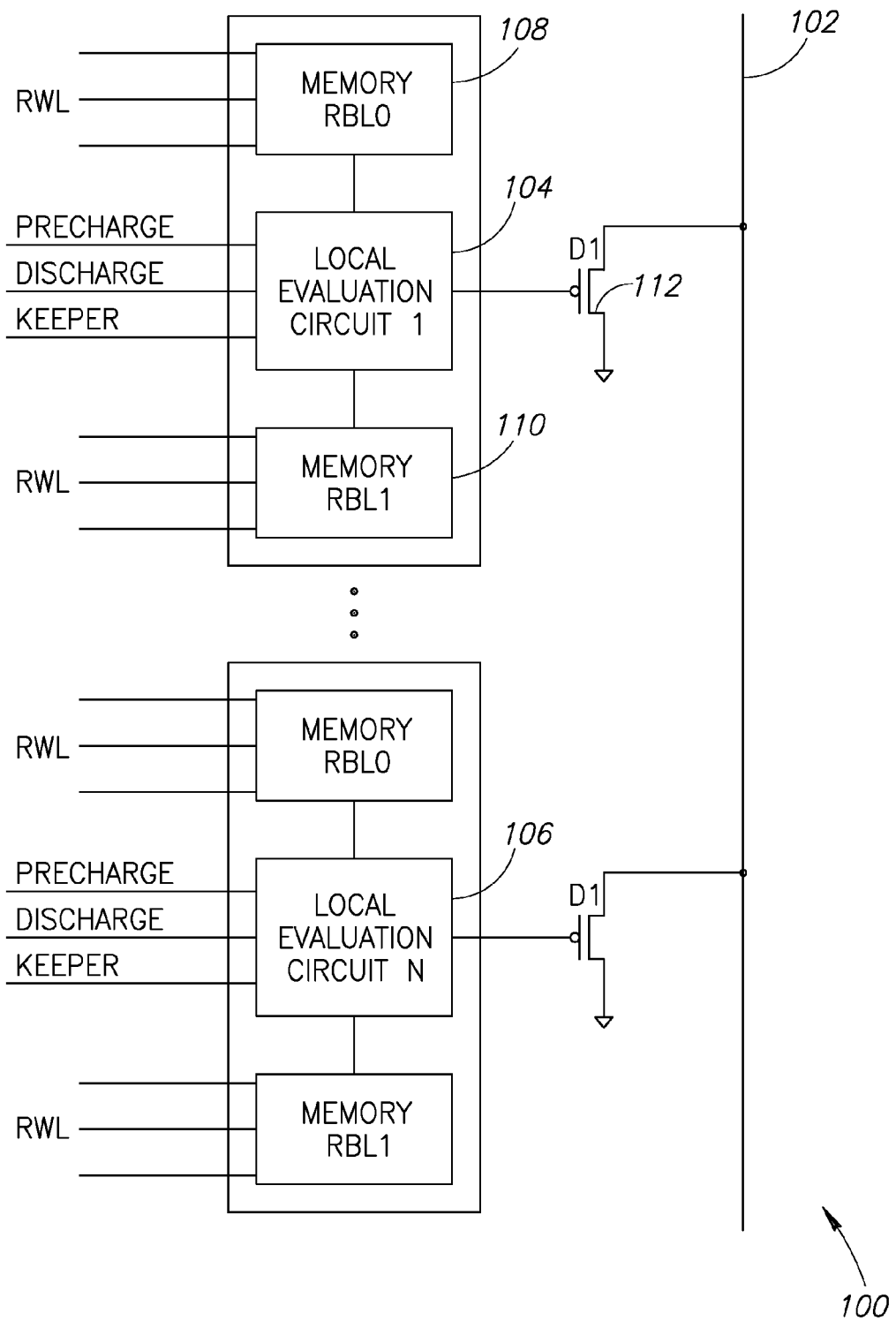
FIG. 1 is a diagram illustrating the method of coupling local evaluation circuits a global bit line of the present invention.

The present invention also provides a method to read a global bit line whose steady state is discharged. SRAM memory cells are coupled to the global bit line via local evaluation circuits as shown in FIG. 1. The diagram, commonly referenced 100 shows global bit line 102 and local evaluation circuits 104, 106. Local evaluation circuit 104 is the first local evaluation circuit coupled to the global bit line, and local evaluation circuit 106 is the Nth local evaluation circuit coupled to the global bit line. Local evaluation circuit 104 is coupled to memory blocks 108, 110 and NFET 112 which is a dynamic node (D1) which couples the local evaluation circuit to the global bit line. In the present invention, only the memory blocks associated with the local evaluation circuit of the memory cell to be evaluated are precharged. The value from the memory cell to be evaluated flows from the memory cell to the local evaluation circuit to the global bit line. Since only the memory cells coupled to a single local evaluation circuit are precharged at any one time, the lower capacitance of the present invention enables all local evaluation circuits can be directly coupled to the global bit line.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software/firmware embodiment or an embodiment containing both hardware and software/firmware elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

Discharging Read Bit Line During Active Mode

Figure 2:
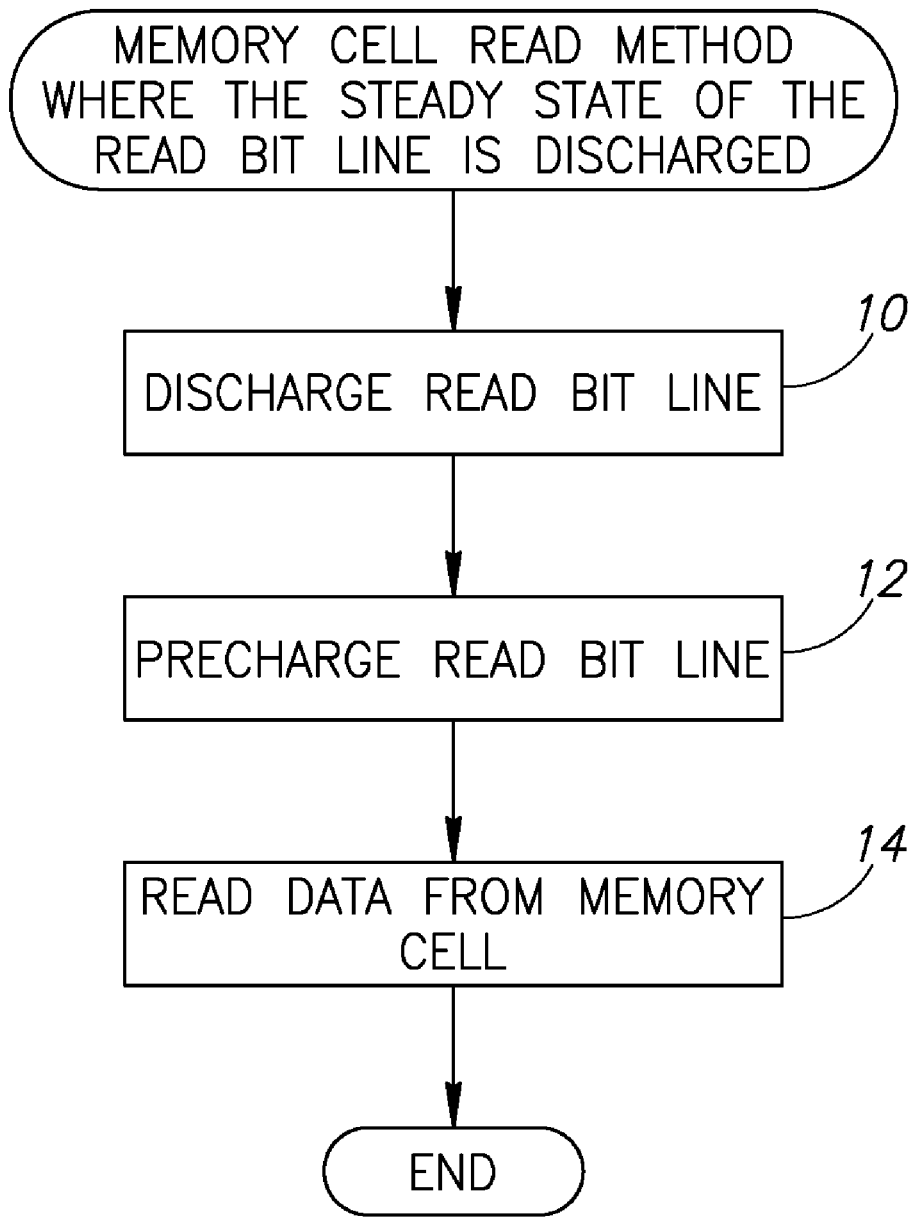
FIG. 2 is a flow diagram illustrating the method of reading the contents of a memory cell where the steady state of the read bit line is discharged of the present invention.

In operation, the invention enables reading SRAM memory cells whose NFET read stack is previously discharged. A flow diagram illustrating the method to read the contents of a memory cell where the steady state of the read bit line is discharged is shown in FIG. 2. The first step is to discharge the bit line of the memory cell to be read (step 10). Next, the read bit line that was previously discharged in step 10 is precharged (step 12). Finally, the data from the memory cell is evaluated (step 14). In the present invention the steady state of the SRAM array is discharged. Only read bit lines that need to be evaluated are precharged. After the cells are evaluated, the read bit line is discharged.

Figure 3:
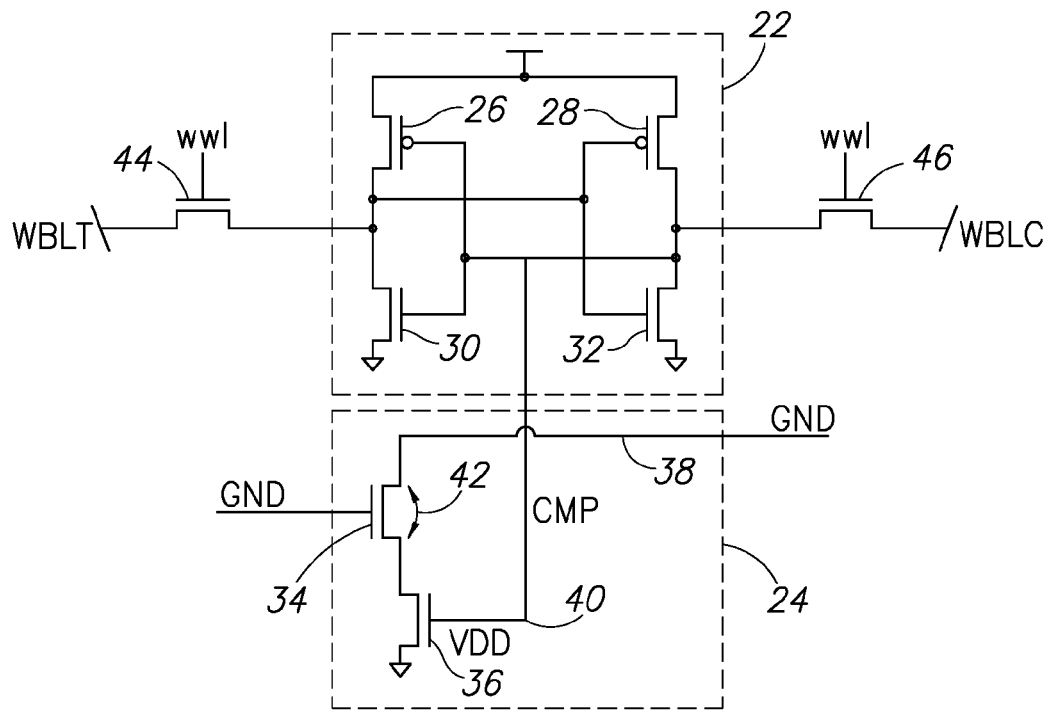
FIG. 3 is a circuit diagram illustrating an 8T SRAM storing the value zero, with the read bit line discharged using the read bit line discharge method of the present invention.
Figure 4:
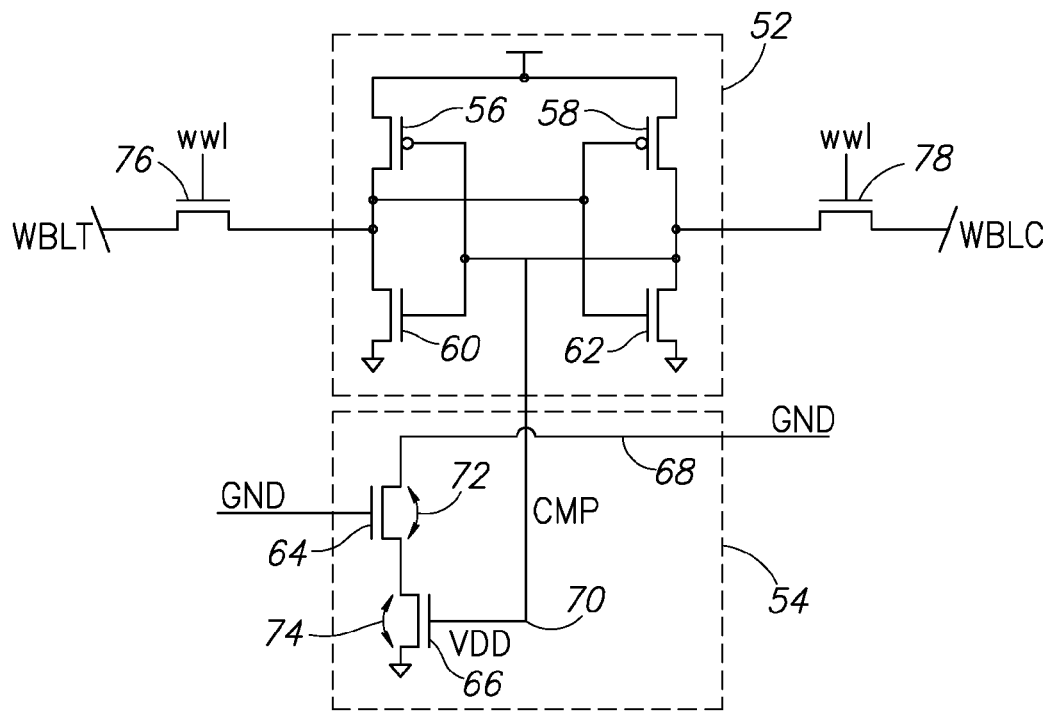
FIG. 4 is a circuit diagram illustrating an 8T SRAM storing the value one, with the read bit line discharged using the read bit line discharge method of the present invention.

The current leakage reduction method of the present invention is shown in FIGS. 3 and 4. FIG. 3 shows the present invention when the memory circuit is in the low state (i.e. storing a zero). The circuit, generally referenced 20, is an 8T SRAM comprising memory storage circuit 22, NFET read stack 24, and NFETs 44, 46. Memory storage circuit 22 is further comprised of NFETs 30, 32 and PFETs 26, 28. NFET read stack 24 is further comprised of NFETs 34, 36. Data is written to the memory cell via the write word lines (WWL) and write bit lines (WBL) coupled to NFETs 44 and 46. Data is read from the memory circuit via the NFET read stack via the read bit line and read word line coupled to NFET 34. In this implementation of an 8T SRAM, the NFET read stack is coupled to the complement side of memory storage circuit 22. In the prior art there was current leakage 42 across NFET 34 since read bit line 38 was precharged to Vdd. Since the steady state of the read bit line is discharged in the present invention, there is no current leakage across any of the NFETS in the NFET read stack.

FIG. 4 shows the present invention when the memory circuit is in the high state (i.e. storing a one). The circuit, generally referenced 50, is an 8T SRAM comprising memory storage circuit 52, NFET read stack 54, and NFETs 76, 78. Memory storage circuit 52 is further comprised of NFETs 60, 62 and PFETs 56, 58. NFET read stack 54 is further comprised of NFETs 64, 66. Data is written to the memory cell via the write word lines (WWL) and write bit lines (WBL) coupled to NFETs 76 and 78. Data is read from the memory circuit via the NFET read stack via the read bit line and read word line coupled to NFET 64. In this implementation of an 8T SRAM, the NFET read stack is coupled to the complement side of memory storage circuit 52. In the prior art there was current leakage 72 across NFET 64 and current leakage 74 across NFET 66 since read bit line 38 was precharged to Vdd. Since the steady state of the read bit line is discharged in the present invention, there is no current leakage across any of the NFETS in the NFET read stack.

Discharging Local And Global Bit Lines During Active Mode

In operation, the steady state of a SRAM array's local and global bit lines in the present invention is discharged. The present invention provides a method to precharge the necessary local and global bit lines prior to a memory cell being evaluated. After the memory cell is evaluated, the present invention provides a method to discharge the previously precharged bit lines. The steps of precharging, evaluating and discharging are all performed within a single clock cycle. Since the steady state of the bit lines is discharged and bit lines are only precharged when necessary, the amount of current leakage in the bit lines is reduced. This in turn significantly reduces the amount of power necessary for the SRAM array.

Figure 5:
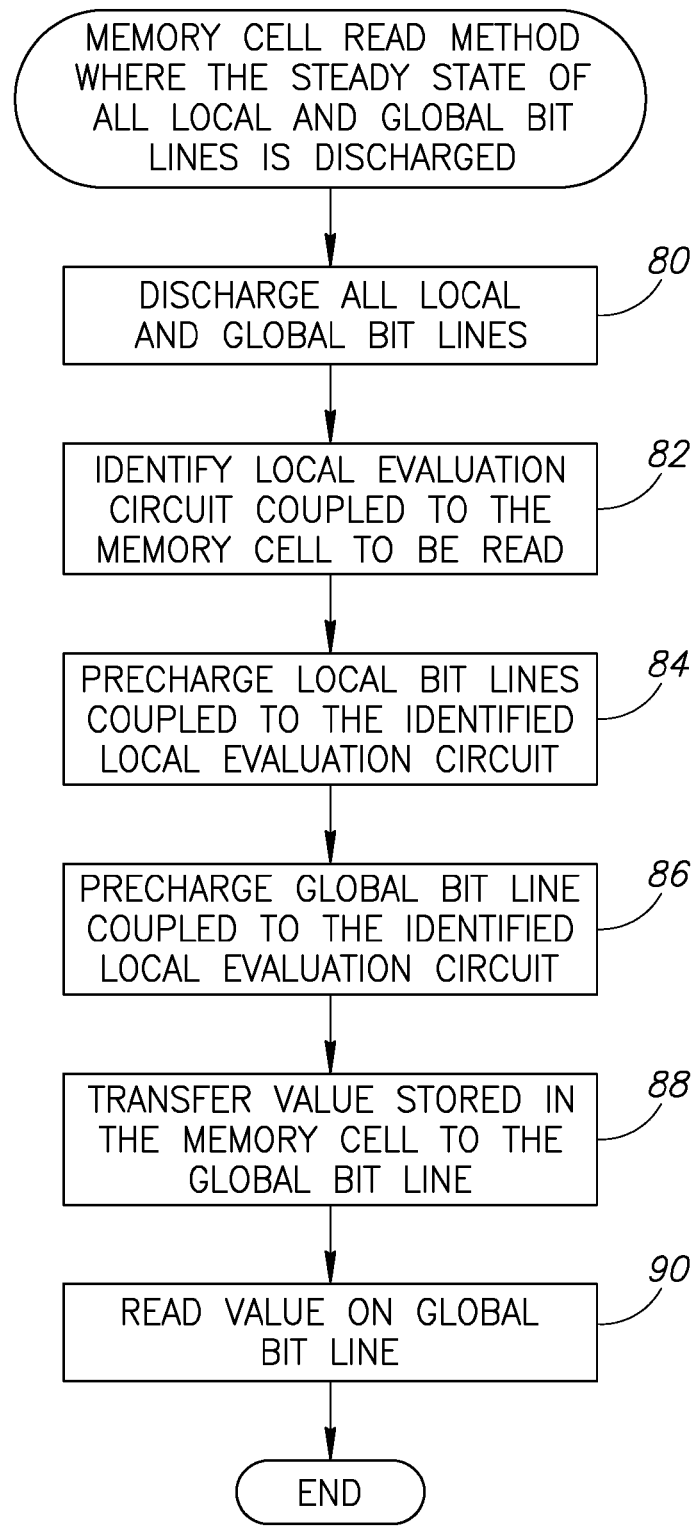
FIG. 5 is a flow diagram illustrating the method of reading the contents of a memory cell where the steady state of all local and global bit lines is discharged of the present invention.

A flow diagram illustrating the discharge of local and global bit lines during active mode method is shown in FIG. 5. In the first step all local and global bit lines are discharged (step 80). The local evaluation circuit associated with the memory cell to be evaluated is then identified via a fast decode path (step 82). The local bit lines of the memory cells associated with the identified local evaluation circuit are then precharged (step 84) and the global bit line coupled to the local evaluation circuit is precharged (step 86). The value of the memory cell to be evaluated is then transferred to the global bit line (step 88), and finally, the value is then read from the global bit line (step 90).

Figure 6:
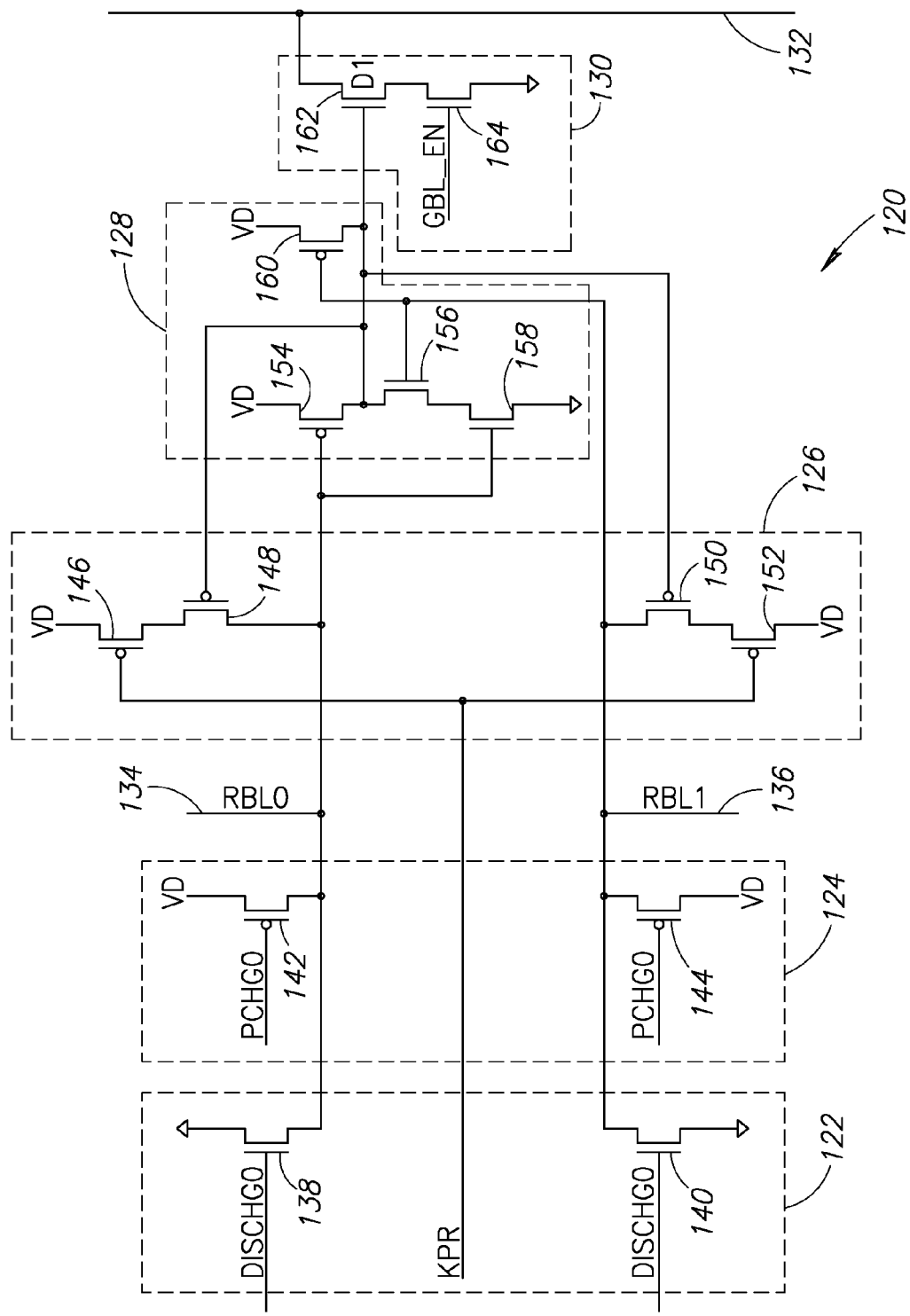
FIG. 6 is a circuit diagram illustrating a local evaluation circuit of the present invention.

An example of a local evaluation circuit for the present invention is shown in FIG. 6. The circuit, generally referenced 120, comprises discharge circuit 122, precharge circuit 124, keeper circuit 126, NAND gate 128, D1 circuit 130, global bit line 132 and local bit lines 134, 136. Discharge circuit 122 comprises NFETs 138 and 140. Precharge circuit 124 comprises PFETs 142 and 144. Keeper circuit 126 comprises PFETs 146, 148, 150 and 152. NAND gate 128 comprises PFETs 154, 160 and NFETs 156, 158. Finally D1 comprises NFETs 162 and 164.

As discussed supra, the read method of the present invention comprises the three steps of discharging, precharging and evaluating to read the contents of a memory cell. These threes steps are all performed during one clock cycle. The addition of the discharge step of the present invention incorporates additional logic in the local evaluation circuit to enable this step. The primary changes to the local evaluation circuit of the present invention is the addition of discharge circuit 122 and an additional NFET 164 coupled to D1, thus creating an NFET stack.

The addition of the discharge circuit enables the discharge step discussed hereinabove. Since the steady state of all local bit lines is discharged, the outputs from the NAND gates in the local evaluation circuits will be a one, thereby causing the global bit lines to be permanently discharged. To solve this problem, NFET 164 is added to dynamic node D1 in order to create an NFET stack. The input signal to the gate of the added NFET is a global bit line enable (GBL_EN) which only allows the local evaluation circuit associated with the memory cell to be read to access the global bit line. The other local evaluation circuits coupled to the global bit line are thereby prevented from discharging the global bit line during a read operation. Note that an alternative implementation of the local evaluation circuit can replace the NAND gate with an inverter.

Figure 7:
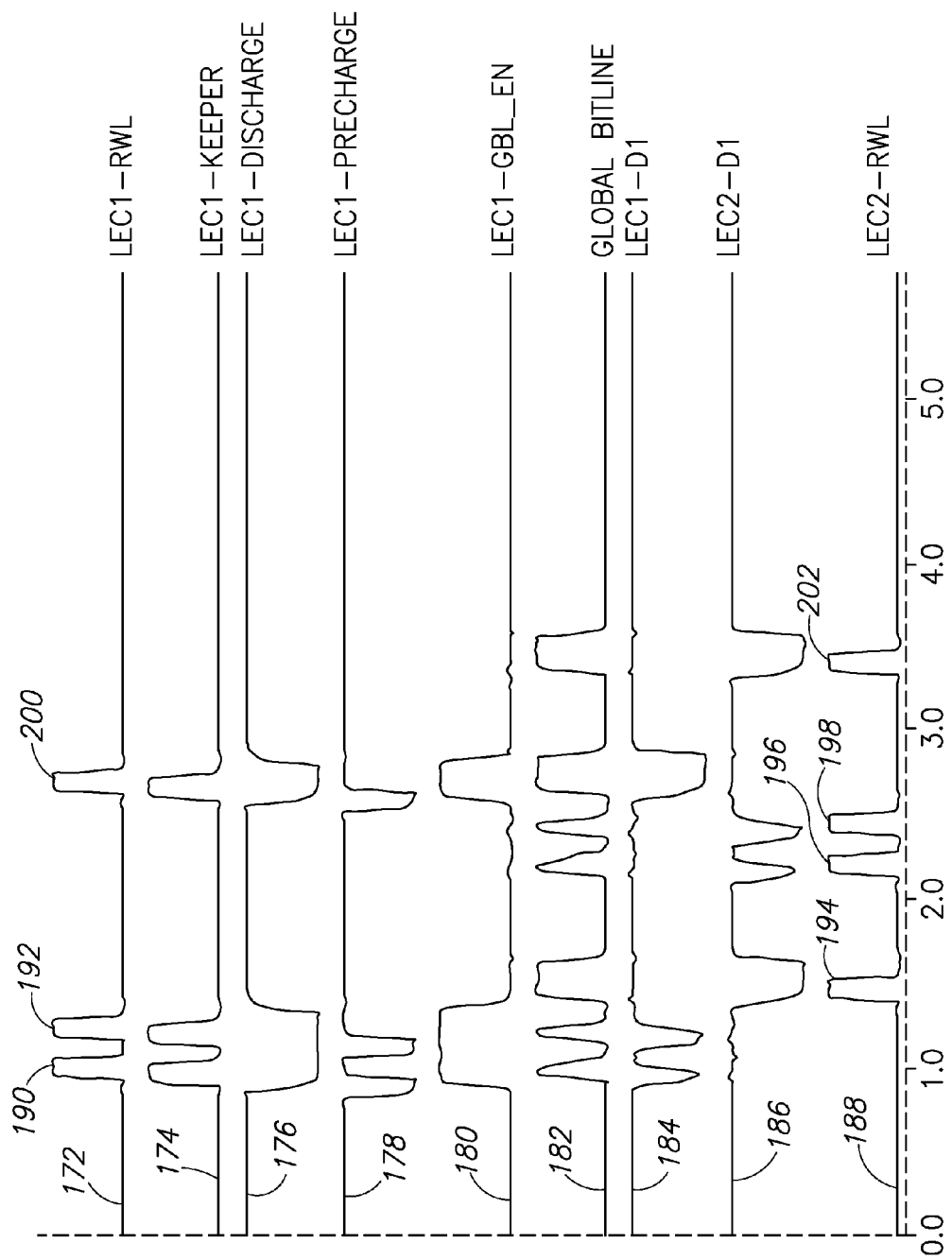
FIG. 7 is a timing diagram illustrating the signals in a local evaluation circuit of the present invention.

An example of a timing diagram that shows the signal value during a read operation using the present invention is shown in FIG. 7. The diagram, generally referenced 170, comprises global bit line 246 which in this case is coupled to local evaluation circuits LEC1 and LEC2. For LEC1, there are signals RWL 172, Keeper 174, Discharge 176, Precharge 178, GBL_EN 180 and D1 184. For LEC2, there are signals D1 186 and RWL 188. There are seven read operations 190, 192, 194, 196, 198, 200 and 202. Note that the steady state of the global bit line is low (i.e., discharged).

For read operations 190 and 192, the RWL for LEC1 is asserted (i.e. goes high). LEC1 D1 remains high, indicating that a zero is read. LEC1 D1 going high discharges the global bit line (which was precharged prior to the read), thereby causing a zero to be read.

For read operations 200, the RWL for LEC1 is asserted (i.e. goes high). LEC1 D1 stays low, indicating that a one is read. LEC1 D1 staying low keeps the global bit line precharged (which was precharged prior to the read), thereby causing a one to be read.

For read operations 196 and 198, the RWL for LEC2 is asserted (i.e. goes high). LEC2 D1 remains high, indicating that a zero is read. LEC2 D1 going high discharges the global bit line (which was precharged prior to the read), thereby causing a zero to be read.

For read operations 194 and 202, the RWL for LEC2 is asserted (i.e. goes high). LEC2 D1 stays low, indicating that a one is read. LEC2 D1 staying low keeps the global bit line precharged (which was precharged prior to the read), thereby causing a one to be read.

Note that in the present invention, the steady state for D1 is high, since the output from the NAND gate is one when both local bit lines are discharged (i.e. the steady state). As the first step of the read operation, precharging causes D1 to go low prior to the evaluation step.

As discussed supra, the steady state of the local and global bit lines in the present invention is discharged. Prior to read operation 190, both discharge signal 176 and precharge signal 178 are high. This keeps the local and global bit lines discharged. The discharge signal is an input to NFETs 138 and 140 in discharge circuit 122 of the local evaluation circuit shown in FIG. 6. The precharge signal is an input to PFETs 142 and 144 in precharge circuit 124 of the local evaluation circuit shown in FIG. 6. Prior to a read operation, both the precharge and discharge signals go low, enabling the local bit lines in the relevant local evaluation circuit to be precharged.

In addition, the GBL_EN signal goes high to precharge the global bit line, whose steady state is discharged.

Note that the precharge signal precedes the read operation by approximately one half of a cycle in order to meet timing constraints. After the local bit line is precharged, keeper signal 174 goes high in order to maintain the charge. An alternative implementation of the local evaluation circuit can use a standard keeper instead of the delayed keeper. A standard keeper can be used when there are a greater number of memory cells coupled to the local evaluation circuit.

Fast Decode Path

As discussed supra, the read method of the present invention comprises the three steps of discharging, precharging and evaluating to read the contents of a memory cell. These threes steps are all performed during one clock cycle. Whereas in the prior art all local and global bit lines are precharged during the first half of the clock cycle, the present invention both discharges all the local and global bit lines and also precharges the necessary local and global bit lines during the first half of the clock cycle. In order to meet timing constraints a fast decode path is necessary to determine the local evaluation circuit whose local bit lines are to be precharged. The fast decode path method decodes the necessary most significant bits of the address of the memory cell to be evaluated. The fast decode path enables both the discharge and precharge steps to be performed during the first half of the clock cycle.

As previously discussed, an example of local evaluation circuits coupled to a global bit line is shown in FIG. 1. A sample implementation will have a 1,024 bit cache memory array comprised of 32 local evaluation circuits. Each local evaluation circuit is further comprised of 32 memory cells, with 16 memory cells coupled to read bit line RBL0 and 16 memory cells coupled to read bit line RBL1. Addressing a memory cell in a 1,024 bit cache memory array requires ten bits ($2^{10}=1024$). Since there are 32 local evaluation circuits in the memory array, only five bits are required to identify the local evaluation circuit ($2^5=32$). The fast decode path utilizes the five most significant bits in the address to rapidly identify the local evaluation circuit to be precharged.

Figure 8:
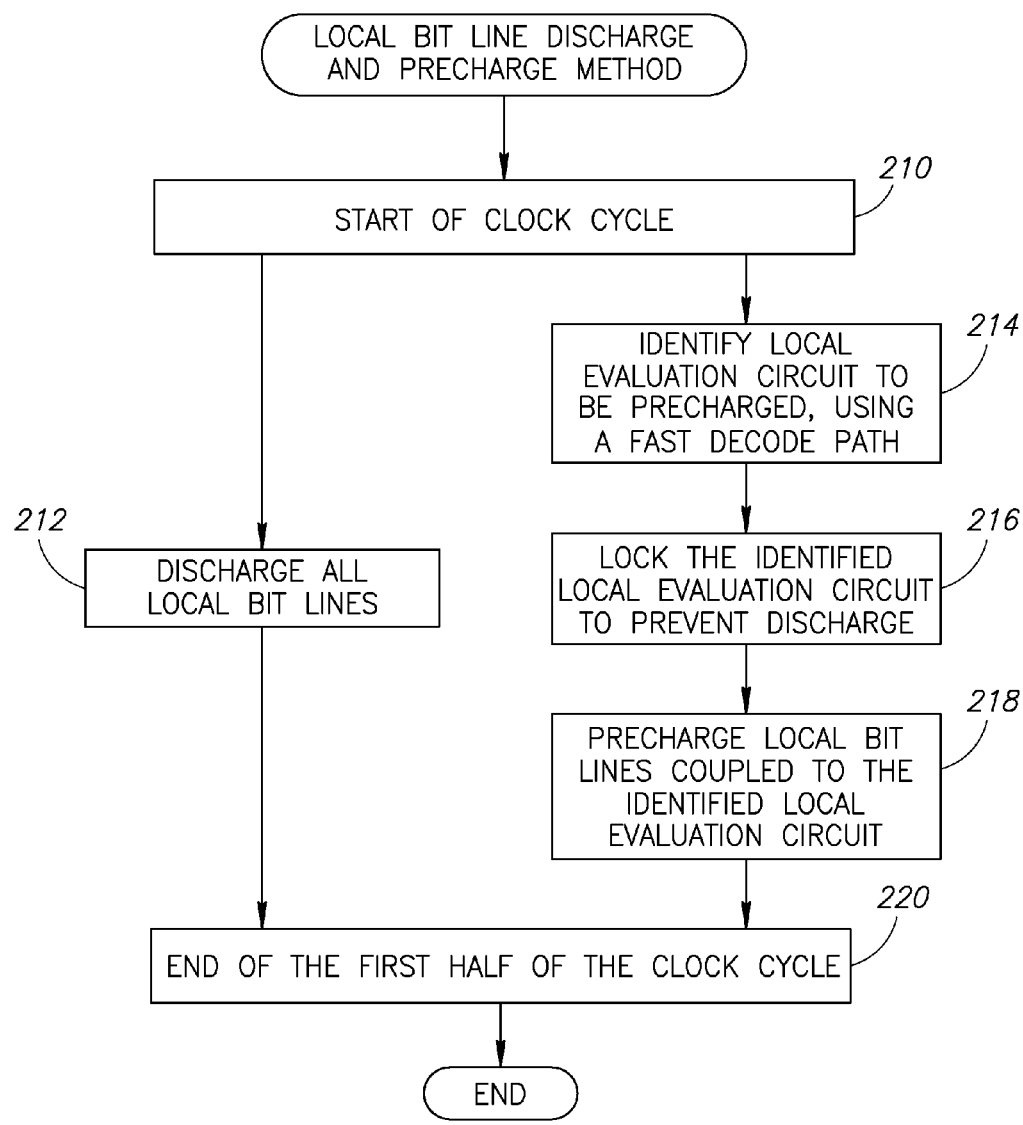
FIG. 8 is a flow diagram illustrating the local bit line discharge and precharge method of the present invention.

As discussed supra, the present invention has the steps of discharging and precharging performed during the first half of the clock cycle. The fast decode path enables the present invention to meet timing constraints. A flow diagram illustrating how the fast decode path is used in the local bit line discharge and precharge method of the present invention is shown in FIG. 8. After the start of the clock cycle (step 210) all local bit lines are discharged (step 212). Simultaneously with the discharge, the local evaluation circuit associated with the memory cell to be read (i.e. whose local bit lines need to be precharged) is identified using a fast decode path (step 214). The local evaluation circuit is then locked to prevent its local bit lines from being discharged by step 212 (performing simultaneously) (step 216). Finally, the local bit lines coupled to the identified local evaluation circuit are then precharged (step 218) before the end of the first half of the clock cycle (step 220).

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A local evaluation circuit coupled to a global bit line and to a plurality of memory cells with read bit lines, comprising:
    means for discharging read bit lines of a plurality of memory cells coupled to said local evaluation circuit during an active mode;
    means for discharging a global bit line coupled to said local evaluation circuit during said active mode;
    means for precharging read bit lines of a plurality of memory cells coupled to said local evaluation circuit during said active mode;
    means for precharging a global bit line coupled to said local evaluation circuit during said active mode; and
    means for transferring data from a memory cell coupled to said local evaluation circuit to a global bit line.

2. The circuit according to claim 1, wherein said memory cell comprises:
    a static random access memory (SRAM) circuit; and
    at least one N channel field effect transistor (NFET) read stack.

3. The circuit according to claim 2, wherein said NFET read stack comprises a plurality of NFETs coupled in series, wherein one end of said NFET read stack is coupled to ground and another end coupled to a read bit line.

4. The circuit according to claim 3, wherein the gate of said NFET coupled to said read bit line is coupled to a control signal.

5. The circuit according to claim 3, wherein the gate of said NFET coupled to ground is coupled to said memory storage device.

6. The circuit according to claim 3, wherein said the steady state of said NFET read stack is discharged.

7. The circuit according to claim 1, wherein the steady state of said read bit lines and said global bit line is discharged.

8. A method of reading a memory cell which is one of a plurality of memory cells comprising a memory array where the steady state of all global and local bit lines coupled to said memory array is discharged, said method comprising the steps of:
    discharging said local bit lines;
    discharging said global bit line;
    precharging said global bit line;
    precharging the local bit line coupled to said memory cell to be read; and
    evaluating data stored in said memory cell to be read.

9. The method according to claim 8, wherein said steady state of said global and local bit lines being discharged is during an active mode.

10. The method according to claim 8, wherein said steady state of said global and local bit lines being discharged is during an inactive mode.

11. The method according to claim 8, wherein said steps of discharging, precharging and evaluating discharging are performed within a single clock cycle.

* * * * *